United States Patent
Shimonishi et al.

(10) Patent No.: US 9,502,317 B2
(45) Date of Patent: Nov. 22, 2016

(54) METHOD FOR MANUFACTURING LIGHT EMITTING DEVICE

(71) Applicant: TOYODA GOSEI CO., LTD., Kiyosu-shi (JP)

(72) Inventors: Shota Shimonishi, Kiyosu (JP); Shigeo Takeda, Kiyosu (JP); Tomohiro Miwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/724,658

(22) Filed: May 28, 2015

(65) Prior Publication Data
US 2015/0380322 A1    Dec. 31, 2015

(30) Foreign Application Priority Data

Jun. 26, 2014  (JP) .................................. 2014-131222

(51) Int. Cl.
| | |
|---|---|
| H01L 21/66 | (2006.01) |
| H01L 33/56 | (2010.01) |
| H01L 33/50 | (2010.01) |
| H01L 25/075 | (2006.01) |
| H01L 33/00 | (2010.01) |

(52) U.S. Cl.
CPC ........... *H01L 22/24* (2013.01); *H01L 25/0753* (2013.01); *H01L 33/0095* (2013.01); *H01L 33/502* (2013.01); *H01L 33/56* (2013.01); *H01L 2933/005* (2013.01); *H01L 2933/0041* (2013.01)

(58) Field of Classification Search
CPC ........... H01L 22/24; H01L 2933/0041; H01L 2933/005; H01L 33/502; H01L 33/56
USPC ............................................................ 438/15
See application file for complete search history.

(56) References Cited

U.S. PATENT DOCUMENTS

| | | | |
|---|---|---|---|
| 2005/0110036 A1* | 5/2005 | Park ..................... | H01L 25/0753 257/99 |
| 2006/0055309 A1* | 3/2006 | Ono ..................... | H01L 25/0753 313/492 |
| 2007/0194333 A1* | 8/2007 | Son ...................... | H01L 25/0753 257/88 |
| 2012/0223352 A1* | 9/2012 | Ishii .................... | C09K 11/0883 257/98 |
| 2013/0161659 A1 | 6/2013 | Matsuura et al. | |

FOREIGN PATENT DOCUMENTS

| | | |
|---|---|---|
| JP | 2002-261325 A | 9/2002 |
| JP | 2013-135082 A | 7/2013 |

* cited by examiner

*Primary Examiner* — Long K Tran
(74) *Attorney, Agent, or Firm* — McGinn IP Law Group, PLLC

(57) ABSTRACT

A method for manufacturing a light emitting device includes providing a wafer including a substrate, a light emitting structure layer and a plurality of electrodes, forming a phosphor layer so as to cover a surface of the wafer on a side of the substrate, dividing the wafer and the phosphor layer so as to form a plurality of light emitting elements, measuring a luminescent chromaticity of the plurality of light emitting elements so as to classify into a first light emitting element having a luminescent chromaticity within a required chromaticity range and a second light emitting element having a luminescent chromaticity outside the required chromaticity range, and forming a second light emitting device that includes the plurality ones of the second light emitting element and the luminescent chromaticity within the required chromaticity range by using the second light emitting element.

11 Claims, 4 Drawing Sheets

METHOD FOR MANUFACTURING LIGHT EMITTING DEVICE

The present application is based on Japanese patent application No. 2014-131222 filed on Jun. 26, 2014, the entire contents of which are incorporated herein by reference.

BACKGROUND OF THE INVENTION

1. Field of the Invention

This invention relates to a method for manufacturing a light emitting device.

2. Description of the Related Art

Conventionally, a light emitting device is known, the light emitting device including a plurality of light emitting elements including an LED chip and a phosphor layer on the surface of the LED chip, the plurality of light emitting elements being configured such that the maximum value of deviations of X values in a chromaticity coordinate of lights emitted from the plurality of light emitting elements is not less than 0.0125 (see e.g. JP-A-2013-135082).

The light emitting device disclosed in JP-A-2013-135082 is capable of emitting a light having a desired chromaticity by combining light emitting elements that have the luminescent chromaticity deviated from the production standard under an appropriate condition.

SUMMARY OF THE INVENTION

It is an object of the invention to provide a method for manufacturing a light emitting device that is adapted to produce a light emitting device with a desired luminescent chromaticity in good yield.

(1) According to one embodiment of the invention, a method for manufacturing a light emitting device comprises:

providing a wafer comprising a substrate, a light emitting structure layer formed on the substrate and a plurality of electrodes formed on the light emitting structure layer;

forming a phosphor layer comprising a resin and a phosphor so as to cover a surface of the wafer on a side of the substrate;

dividing the wafer and the phosphor layer so as to form a plurality of light emitting elements each of which comprises the substrate, the light emitting structure layer, the electrodes and the phosphor layer;

measuring a luminescent chromaticity of the plurality of light emitting elements so as to classify into a first light emitting element having a luminescent chromaticity within a required chromaticity range and a second light emitting element having a luminescent chromaticity outside the required chromaticity range; and forming a second light emitting device that comprises the plurality ones of the second light emitting element and the luminescent chromaticity within the required chromaticity range by using the second light emitting element.

In the above embodiment (1) of the invention, the following modifications and changes can be made.

(i) The method further comprises forming a first light emitting device that comprises a single one of the first light emitting element and the luminescent chromaticity within the required chromaticity range by using the first light emitting element.

(ii) The dividing of the wafer and the phosphor layer and the measuring of the luminescent chromaticity are conducted while the wafer covered with the phosphor layer is turned over such that a surface of the wafer on a side of the light emitting structure layer is faced up after the phosphor layer is formed.

(iii) The plurality of light emitting elements comprise a flip-chip type element.

EFFECTS OF THE INVENTION

According to one embodiment of the invention, a method for manufacturing a light emitting device can be provided that is adapted to produce a light emitting device with a desired luminescent chromaticity in good yield.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Embodiment

The above-mentioned drawings show one example of the manufacturing process of the light emitting device according to the embodiment. Hereinafter, the manufacturing process of the light emitting device according to the embodiment will be explained step by step by using the above-mentioned drawings.

(Preparation of Wafer)

Figure 1A:
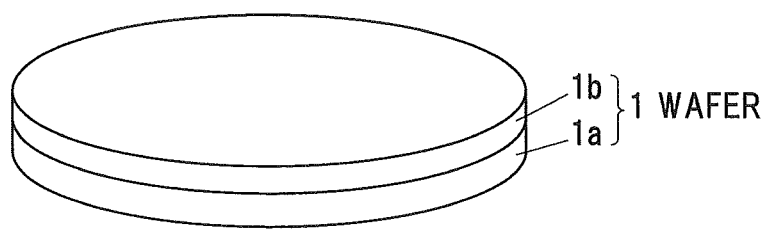
FIG. 1A is a perspective view showing a wafer used in one embodiment of the invention.

First, a wafer 1 shown in FIG. 1A is prepared, the wafer 1 including a substrate 1a, a light emitting structure layer 1b formed on the substrate 1a and a plurality of electrodes 1c formed on the light emitting structure layer 1b. In FIG. 1A, the electrodes 1c are not shown.

Figure 1B:
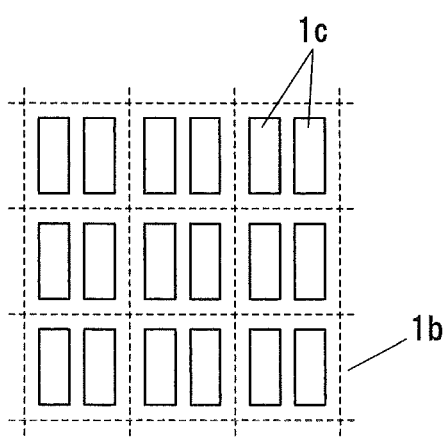
FIG. 1B is a top view showing a part of the wafer used in the embodiment.

FIG. 1B is a partial top view schematically showing the surface of the wafer 1 on the side of the light emitting structure layer 1b. Dotted lines in FIG. 1B represent positions at which a cutting work is carried out in a subsequent dicing process. Regions defined by the dotted lines are regions to be respectively fabricated to a light emitting element by the dicing process, and in each of the regions, two electrodes 1c of an n-side electrode and a p-side electrode are formed.

The substrate 1a is a transparent substrate such as a sapphire substrate. The substrate 1a has, for example, a diameter of 8 inches. The light emitting structure layer 1b is a laminated structure comprised of, for example, a nitride semiconductor, and includes a light emitting layer sandwiched between an n-type clad layer and a p-type clad layer.

Next, a step of forming the light emitting element by using the wafer 1 will be explained.

(Forming of Light Emitting Element)

Figure 2A:
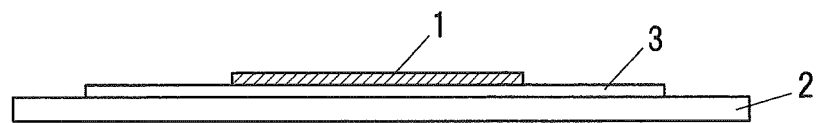
FIGS. 2A to 2F are vertical cross-sectional views showing one example of the manufacturing process according to the embodiment.

First, as shown FIG. 2A, the wafer 1 is fixed on a carrier board 2 comprised of stainless steel or the like via a double sided adhesive sheet 3. At this time, a surface of the wafer 1 on the side of the light emitting structure layer 1b is brought into contact with the double sided adhesive sheet 3 so that the surface of the wafer 1 on the side of the substrate 1a is directed to the upper side.

It is preferable that the double sided adhesive sheet 3 is a sheet that can be separated in a high temperature. Further, a means for fixing the wafer 1 on the carrier board 2 is not limited to the double sided adhesive sheet 3.

Figure 2B:
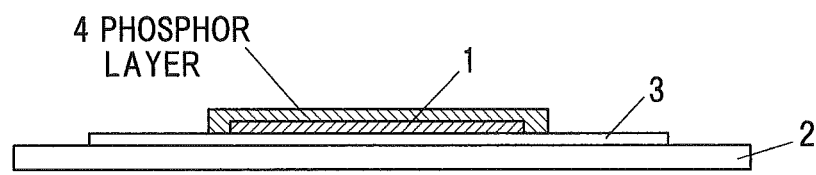

Next, as shown in FIG. 2B, the phosphor layer 4 comprised of a resin containing a phosphor is formed by a compression molding so as to cover the surface of the wafer 1 on the side of the substrate 1a. The phosphor layer 4 is comprised of a transparent resin such as a silicone based resin, an epoxy based resin, and includes a phosphor of particle shape.

Figure 2C:
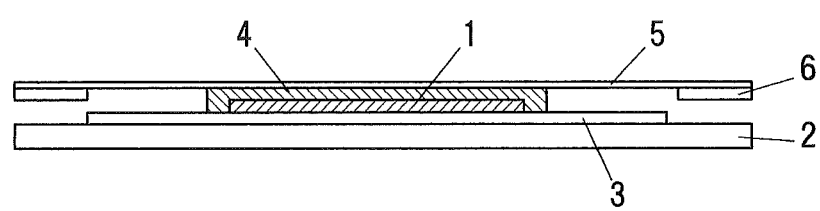

Next, as shown in FIG. 2C, a dicing tape 5 held by an annular frame 6 is stuck on the phosphor layer 4 covering the wafer 1.

Figure 2D:
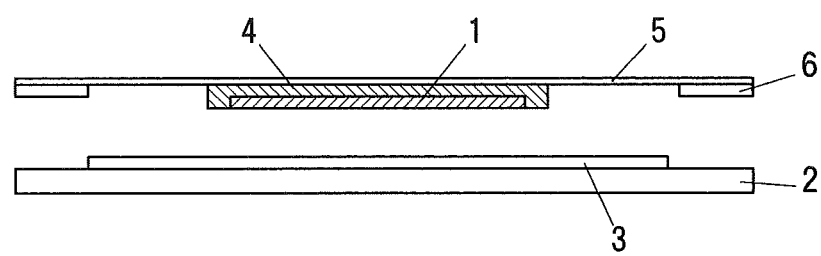

Next, as shown in FIG. 2D, the dicing tape 5 stuck on the phosphor layer 4 is moved upward in a state of heating at around 170 degrees C. so that the phosphor layer 4 and the wafer 1 are peeled from the carrier board 2 (the double sided adhesive sheet 3).

Figure 2E:
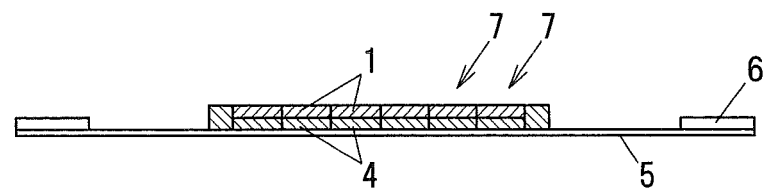
Figure 2F:
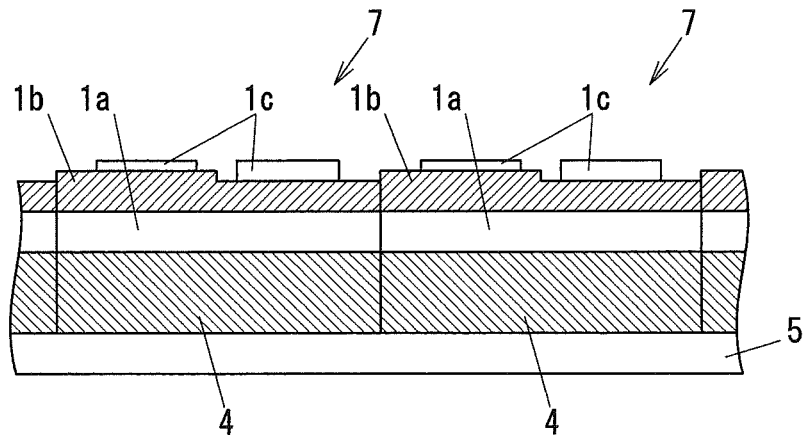

Next, as shown in FIG. 2E, the wafer 1 covered with the phosphor layer 4 held by the dicing tape 5 is turned over, and plasma cleaning using plasma or the like is applied to the surface of the wafer 1 directed upward on the side of the light emitting structure layer 1b, followed by dividing the wafer 1 and the phosphor layer 4 by dicing so as to form the plurality of the light emitting elements 7 each of which has the substrate 1a, the electrodes 1c and the phosphor layer 4. FIG. 2F is a drawing obtained by partially enlarging FIG. 2E.

The light emission color of the light emitting element 7 becomes a mixed color of a color of a light emitted from the light emitting layer in the light emitting structure layer 1b and a fluorescent color of the phosphor contained in the phosphor layer 4. For example, if the light emission color of the light emitting layer in the light emitting structure layer 1b is blue and the fluorescent color of the phosphor contained in the phosphor layer 4 is yellow, the light emission color of the light emitting element 7 becomes white. Further, the light emitting element 7 is a flip-chip type element, and for example, is an LED chip or a laser diode chip.

Next, a power source is connected to the exposed electrodes 1c on the light emitting structure layer 1b of each of the light emitting elements 7 while the state is maintained that the surface of the wafer 1 on the side of the light emitting structure layer 1b is directed upward, so as to make each of the light emitting elements 7 to emit a light in order, followed by measuring the luminescent chromaticity respectively. In addition, a characteristic map data including the position on the dicing tape 5 and the information about the luminescent chromaticity of each of the light emitting elements 7 is prepared.

Next, based on the characteristic map data obtained, the light emitting elements 7 are classified into the light emitting element 7 having the luminescent chromaticity within a predetermined required chromaticity range (hereinafter referred to as a first light emitting element 7a) and the light emitting element 7 having the luminescent chromaticity outside the required chromaticity range (hereinafter referred to as a second light emitting element 7b). Further, the light emitting elements 7 that have a problem with light emission characteristics other than the chromaticity such as light emission intensity so as to be judged as being defective are disposed.

For example, the chromaticity range of 3-step or 7-step of ANSI (American National Standards Institute) is set as the above-mentioned required chromaticity range.

The first light emitting element 7a can be used as an element such as a SMD (Surface Mount Device) element that is packaged in a form of a single body. The second light emitting element 7b cannot emit a light having the luminescent chromaticity within the required chromaticity range in a form of a single body, thus a plurality of the second light emitting elements 7b are used in combination with each other so as to be able to emit a light having the luminescent chromaticity within the required chromaticity range.

Next, a step of manufacturing a light emitting device by using the first light emitting element 7a having the luminescent chromaticity within the required chromaticity range will be explained.

(Manufacturing 1 of Light Emitting Device)

Figure 3A:
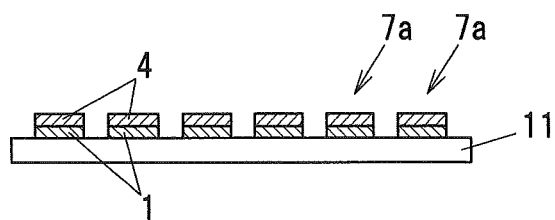
FIGS. 3A to 3D are vertical cross-sectional views showing one example of the manufacturing process according to the embodiment.

First, as shown in FIG. 3A, the first light emitting elements 7a are aligned and mounted on the substrate 11 at predetermined intervals. At this time, the electrodes 1c on the light emitting structure layer 1b of each of the first light emitting elements 7a are connected to electrodes (not shown) on the substrate 11.

The substrate 11 is, for example, a LTCC (Low Temperature Co-fired Ceramics) substrate that has an inner layer wiring. The electrodes 1c and the electrodes on the substrate 11 are connected to each other, for example, by using a AuSn film formed on the surface of the electrodes 1c and a Ag nano paste printed on the electrodes of the substrate 11 and by carrying out heat treatment at a temperature of 300 degrees C.

Figure 3B:
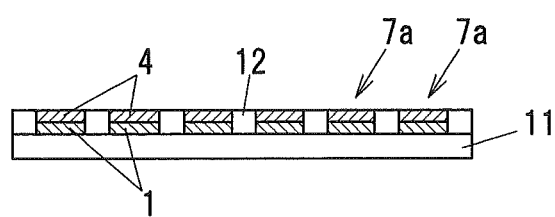

Next, as shown in FIG. 3B, a white resin 12 is filled in regions among the first light emitting elements 7a on the substrate 11 by potting or the like. The white resin 12 is a resin such as a silicone based resin containing a white dye such as titanium oxide.

Figure 3C:
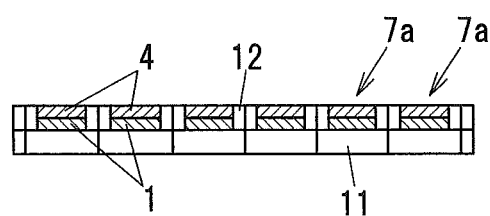

Next, as shown in FIG. 3C, the substrate 11 and the white resin 12 are divided by dicing.

Figure 3D:
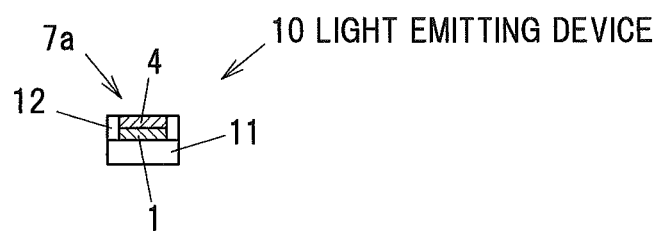

Thereby, the light emitting device 10 as shown in FIG. 3D including the substrate 11, the first light emitting element 7a and the white resin 12 surrounding the first light emitting element 7a is obtained.

The light emitting device 10 is a light emitting device that has one light emitting element. The one light emitting element 7a included in the light emitting device 10 has the luminescent chromaticity within the required chromaticity range, thus the light emitting device 10 has also the luminescent chromaticity within the required chromaticity range.

Next, a step of manufacturing a light emitting device by using the second light emitting element 7b having the luminescent chromaticity outside the required chromaticity range will be explained.

(Manufacturing 2 of Light Emitting Device)

Figure 4A:
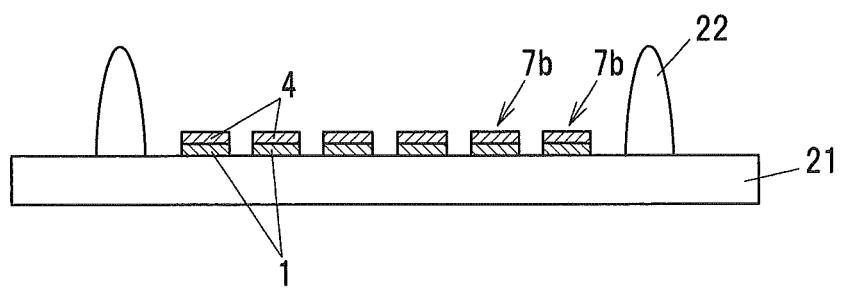
FIGS. 4A and 4B are vertical cross-sectional views showing one example of the manufacturing process according to the embodiment.

First, as shown in FIG. 4A, a plurality of the second light emitting elements 7b are mounted on a substrate 21 of a COB (Chip On Board) package. The plurality of the second light emitting elements 7b are mounted in a region inside an annular dam 22 formed on the substrate 21.

At this time, the electrodes 1c on the light emitting structure layer 1b of each of the second light emitting elements 7b is connected to electrodes (not shown) on the substrate 21. The electrodes 1c and the electrodes on the substrate 21 are connected to each other, for example, by using a AuSn film formed on the surface of the electrodes 1c and a Ag nano paste printed on the electrodes of the substrate 21 and by carrying out heat treatment at a temperature of 300 degrees C.

The plurality of the second light emitting elements 7b mounted on one substrate 21 are selected such that the luminescent chromaticity of the light emitting device 20 described below becomes within the required chromaticity range.

The substrate 21 is, for example, an aluminum substrate that has a wiring in the surface thereof. The dam 22 is, for example, comprised of a resin such as a silicone based resin or an epoxy based resin containing a white dye such as titanium oxide.

Figure 4B:
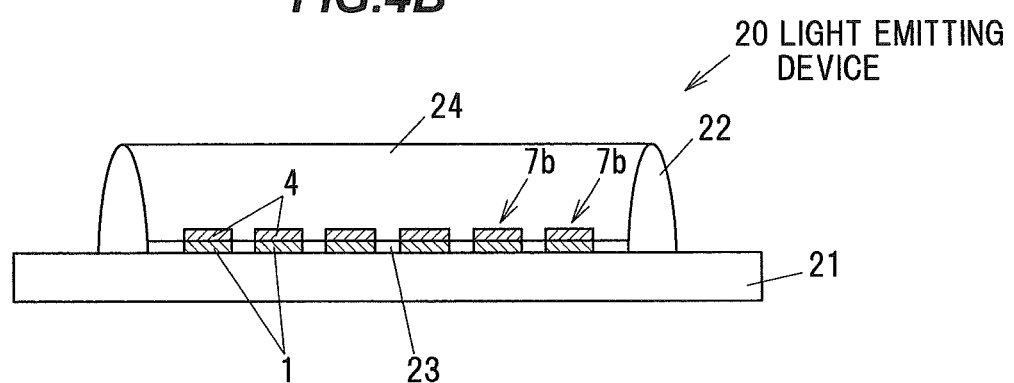

Next, as shown in FIG. 4B, a white resin 23 is filled in regions among the second light emitting elements 7b on the substrate 21 by potting or the like, after that, a sealing material 24 is filled in a region inside the dam 22 by potting or the like.

The white resin 23 is a resin such as a silicone based resin containing a white dye such as titanium oxide. The sealing material 24 is comprised of a transparent resin such as a silicone based resin, but each of the second light emitting elements 7b has the phosphor layer 4, thus the phosphor is not required to be contained.

Thereby, the light emitting device 20 of a COB type as shown in FIG. 4B including a plurality of the second light emitting elements 7b is obtained. Each of the second light emitting elements 7b has the luminescent chromaticity outside the required chromaticity range, but the plurality of the second light emitting elements 7b included in the light emitting device 20 has the luminescent chromaticity as an average value within the required chromaticity range, thus the light emitting device 20 has the luminescent chromaticity within the required chromaticity range.

Advantageous Effects of Embodiment

According to the above-mentioned embodiment, the luminescent chromaticity of the light emitting element including the phosphor layer is measured and then the element is mounted in the light emitting device, thus in comparison with a case that the light emitting element is mounted and then phosphor layer is formed, it becomes possible to more accurately control the luminescent chromaticity of the light emitting device.

In addition, even if the light emitting element is a light emitting element having the luminescent chromaticity outside the required chromaticity range, a plurality of the light emitting elements are used in combination with each other, thereby a light emitting device having the luminescent chromaticity within the required chromaticity range can be manufactured. Consequently, the number of the light emitting device disposed can be reduced and the manufacturing yield of the light emitting device can be enhanced.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the above-mentioned embodiment, the phosphor layer 4 is formed by a compression molding, but the forming method of the phosphor layer 4 is not limited to this, and other methods such as a spin coating, a spray coating, a sticking of a phosphor sheet can be used.

It should be noted that the above-mentioned embodiment(s) does not limit the construe of the appended claims. In particular, it should be noted that all of the combinations of features as described in the embodiment are not always needed to solve the problem of the invention.

What is claimed is:

1. A method for manufacturing a light emitting device, comprising:
   providing a wafer comprising a substrate, a light emitting structure layer formed on the substrate, and a plurality of electrodes formed on the light emitting structure layer;
   forming a phosphor layer comprising a resin and a phosphor so as to cover a surface of the wafer on a side of the substrate: dividing the wafer and the phosphor layer so as to form a plurality of light emitting elements each of which comprises the substrate, the light emitting structure layer, the electrodes and the phosphor layer;
   measuring a luminescent chromaticity of the plurality of light emitting elements so as to classify into a first light emitting element having a luminescent chromaticity within a required chromaticity range and a second light emitting element having a luminescent chromaticity outside the required chromaticity range;
   forming a first light emitting device that comprises a single one of the first light emitting element and the luminescent chromaticity within the required chromaticity range by using the first light emitting element; and
   forming a second light emitting device that comprises the plurality ones of the second light emitting element and the luminescent chromaticity within the required chromaticity range by using the second light emitting element,
   wherein the dividing of the wafer and the phosphor layer and the measuring of the luminescent chromaticity are conducted while the wafer covered with the phosphor layer is turned over such that a surface of the wafer on a side of the light emitting structure layer is faced up after the phosphor layer is formed.

2. A method for manufacturing a light emitting device, comprising:
   providing a wafer comprising a substrate, a light emitting structure layer formed on the substrate, and a plurality of electrodes formed on the light emitting structure layer;
   forming a phosphor layer comprising a resin and a phosphor so as to cover a surface of the wafer on a side of the substrate;
   dividing the wafer and the phosphor layer so as to form a plurality of light emitting elements each of which comprises the substrate, the light emitting structure layer, the electrodes and the phosphor layer;
   measuring a luminescent chromaticity of the plurality of light emitting elements so as to classify into a first light emitting element having a luminescent chromaticity within a required chromaticity range and a second light emitting element having a luminescent chromaticity outside the required chromaticity range;
   forming a first light emitting device that comprises a single one of the first light emitting element and the luminescent chromaticity within the required chromaticity range by using the first light emitting element; and
   forming a second light emitting device that comprises the plurality ones of the second light emitting element and the luminescent chromaticity within the required chromaticity range by using the second light emitting element.

3. The method according to claim 1, wherein the plurality of light emitting elements comprise a flip-chip type element.

4. The method according to claim 1, wherein the second light emitting device includes only light emitting elements in the second category.

5. The method according to claim 1, wherein the first light emitting device includes only the single one of the first light emitting element in the first category.

6. The method according to claim 1, further comprising preparing a characteristic map including a position of each of the plurality of light emitting elements and the measurement of the luminescent chromaticity for each of the plurality of light emitting elements corresponding to the position.

7. The method according to claim 1, wherein the wafer is provided on a carrier board such that the surface of the wafer on the side of the substrate faces away from the carrier board.

8. The method according to claim 7, further comprising applying a dicing tape held by an annular frame on the phosphor layer covering the wafer and moving the dicing tape stuck to the phosphor layer away from the phosphor layer so that the phosphor layer and the wafer are peeled from the carrier board.

9. The method according to claim 8, wherein the moving the dicing tape is moved in a state of heating.

10. The method according to claim 8, further comprising preparing a characteristic map including a position on the dicing tape for each of the plurality of light emitting elements such that the measured luminescent chromaticity is recorded according to the position on the characteristic map.

11. A method for manufacturing a light emitting device including a wafer having a substrate, a light emitting structure layer formed on the substrate, and a plurality of electrodes formed on the light emitting structure layer and a phosphor layer having a resin and a phosphor so as to cover a surface of the wafer on a side of the substrate, the method comprising:

dividing the wafer and the phosphor layer so as to form a plurality of light emitting elements each of which comprises the substrate, the light emitting structure layer, the electrodes and the phosphor layer;

measuring a luminescent chromaticity of the plurality of light emitting elements so as to classify into a first category having a first light emitting element having a luminescent chromaticity within a required chromaticity range and a second category having a second light emitting element having a luminescent chromaticity outside the required chromaticity range;

wherein the dividing of the wafer and the phosphor layer and the measuring of the luminescent chromaticity are conducted while the wafer covered with the phosphor layer is turned over such that a surface of the wafer on a side of the light emitting structure layer is faced up after the phosphor layer is formed forming a first light emitting device that comprises a single one of the first light emitting element and the luminescent chromaticity within the required chromaticity range by using the first light emitting element; and forming a second light emitting device that comprises a plurality of the second light emitting element including the luminescent chromaticity outside the required chromaticity range used in combination with each other so as to be able to emit a light having the luminescent chromaticity within the required chromaticity range.

* * * * *